(12) United States Patent
Watanabe et al.

(10) Patent No.: US 11,388,847 B2
(45) Date of Patent: Jul. 12, 2022

(54) ELECTROMAGNETIC WAVE SHIELDING FILM

(71) Applicant: Tatsuta Electric Wire & Cable Co., Ltd., Higashiosaka (JP)

(72) Inventors: Masahiro Watanabe, Kizugawa (JP); Shigeki Takeshita, Kizugawa (JP)

(73) Assignee: TATSUTA ELECTRIC WIRE & CABLE CO., LTD., Higashiosaka (JP)

(*) Notice: Subject to any disclaimer, the term of this patent is extended or adjusted under 35 U.S.C. 154(b) by 171 days.

(21) Appl. No.: 16/965,427

(22) PCT Filed: Jan. 17, 2019

(86) PCT No.: PCT/JP2019/001234
§ 371 (c)(1),
(2) Date: Jul. 28, 2020

(87) PCT Pub. No.: WO2019/150969
PCT Pub. Date: Aug. 8, 2019

(65) Prior Publication Data
US 2021/0120709 A1    Apr. 22, 2021

(30) Foreign Application Priority Data

Jan. 30, 2018   (JP) .............................. JP2018-013784

(51) Int. Cl.
*H05K 9/00*      (2006.01)
*H05K 1/02*      (2006.01)

(52) U.S. Cl.
CPC ......... *H05K 9/0081* (2013.01); *H05K 1/0218* (2013.01)

(58) Field of Classification Search
None
See application file for complete search history.

(56) References Cited

U.S. PATENT DOCUMENTS

2015/0342099 A1* 11/2015 Jang .................... H01F 1/16
                                                           428/323
2016/0286698 A1*  9/2016 Chang .................. B32B 27/14
(Continued)

FOREIGN PATENT DOCUMENTS

JP        2004095566 A      3/2004

OTHER PUBLICATIONS

International Search Report dated Apr. 2, 2019, issued in International Application No. PCT/JP2019/001234.
(Continued)

*Primary Examiner* — Hung V Ngo
(74) *Attorney, Agent, or Firm* — United IP Counselors, LLC; Kenneth M. Fagin

(57) ABSTRACT

An electromagnetic wave shielding film includes an insulating protective layer, and a release film covering a surface of the insulating protective layer. The release film has a transmittance of 20-80% at a wavelength of 535 nm, a tight attachment confirmability index Ia of 11 or more, the tight attachment confirmability index Ia being represented by expression 1, and a presence visibility index Iv of 11 or more, the presence visibility index Iv being represented by expression 2.

$$Ia = (\Delta L^{*2}_1 + \Delta a^{*2}_1 + \Delta b^{*2}_1)^{0.5} \quad \text{(expression 1)}$$

$$Iv = (\Delta L^{*2}_2 + \Delta a^{*2}_2 + \Delta b^{*2}_2)^{0.5} \quad \text{(expression 2)}$$

4 Claims, 3 Drawing Sheets

(56) References Cited

U.S. PATENT DOCUMENTS

2018/0077829 A1* 3/2018 Yamamoto ................ B32B 7/12
2018/0134920 A1* 5/2018 Takami ................... B32B 27/42
2018/0352688 A1* 12/2018 Jang ...................... H01F 27/366
2021/0040289 A1* 2/2021 Takahashi .............. H05K 1/023

OTHER PUBLICATIONS

Written Opinion dated Apr. 2, 2019, issued in International Application No. PCT/JP2019/001234.

* cited by examiner

ELECTROMAGNETIC WAVE SHIELDING FILM

CROSS-REFERENCE TO RELATED APPLICATIONS

This application is the U.S. National Phase of PCT application PCT/JP2019/001234 filed Jan. 17, 2019, the contents of which are incorporated herein by reference in their entirety. The PCT application, in turn, claims the priority benefit of Japanese application JP 2018-013784 filed Jan. 30, 2018, the contents of which are incorporated herein by reference in their entirety.

TECHNICAL FIELD

The present disclosure relates to electromagnetic wave shielding films.

BACKGROUND ART

An electromagnetic wave shielding film is attached to a surface of a printed wiring board in order to block electromagnetic noise. A typical electromagnetic wave shielding film is a stack of a conductive adhesive layer and an insulating protective layer. A release film is provided on a surface of the insulating protective layer in order to prevent or reduce damage to the insulating protective layer during transportation. The release film is released after the electromagnetic wave shielding film is attached to a printed wiring board (see, for example, Patent Document 1).

CITATION LIST

Patent Document

Patent Document 1: Japanese Unexamined Patent Publication No. 2004-095566

SUMMARY OF THE INVENTION

Technical Problem

Meanwhile, a printed wiring board to which an electromagnetic wave shielding film is attached may be immersed in a chemical liquid. In that case, the release film is required to serve as a protective film in a chemical liquid process. However, unless the release film and the insulating protective layer are tightly attached together, the liquid enters the gap between the release film and the insulating protective layer. Therefore, before the immersion in the chemical liquid, it is necessary to check whether or not the release film and the insulating protective layer are tightly attached together.

The higher the transparency of the release film, the easier it is to check the tightness of the attachment. However, when a release film having high transparency is used, it is difficult to confirm the presence of the release film itself, and it is likely to miss releasing the release film after the immersion process. If reflow is performed without release of the release film, the release film is melted, leading to a defective product or damage to a reflow oven.

The present disclosure describes implementations of an electromagnetic wave shielding film having a release film that is easily checked to see if the release film is tightly attached to an insulating protective layer and if the release film is present.

Solution to the Problem

An example electromagnetic wave shielding film according to the present disclosure includes an insulating protective layer, and a release film covering a surface of the insulating protective layer. The release film has a transmittance of 20-80% at a wavelength of 535 nm, a tight attachment confirmability index Ia of 11 or more, the tight attachment confirmability index Ia being represented by expression 1, and a presence visibility index Iv of 11 or more, the presence visibility index Iv being represented by expression 2, $$Ia = (\Delta L^*_1{}^2 + \Delta a^*_1{}^2 + \Delta b^*_1{}^2)^{0.5} \quad \text{(expression 1)}$$

$$Iv = (\Delta L^*_2{}^2 + \Delta a^*_2{}^2 + \Delta b^*_2{}^2)^{0.5} \quad \text{(expression 2)}$$

where $\Delta L^*_1$ represents a difference between the L* value of a surface of the release film before release and the L* value of the surface of the release film after release, $\Delta a^*_1$ represents a difference between the a* value of the surface of the release film before release and the a* value of the surface of the release film after release, and $\Delta b^*_1$ represents a difference between the b* value of the surface of the release film before release and the b* value of the surface of the release film after release, and $\Delta L^*_2$ represents a difference between the L* value of the surface of the release film before release and the L* value of the surface of the insulating protective layer after release of the release film, $\Delta a^*_2$ represents a difference between the a* value of the surface of the release film before release and the a* value of the surface of the insulating protective layer after release of the release film, and $\Delta b^*_2$ represents a difference between the b* value of the surface of the release film before release and the b* value of the surface of the insulating protective layer after release of the release film, provided that the surface of the release film after release is opposite a surface of the release film that is attached to the insulating protective layer before release.

The example electromagnetic wave shielding film of the present disclosure may further include an adhesive layer provided on the opposite side of the insulating protective layer from the release film.

In this case, the example electromagnetic wave shielding film of the present disclosure may further include a shielding layer provided between the insulating protective layer and the adhesive layer.

An example shielded wiring board according to the present disclosure includes a printed wiring board having a ground circuit, and the example electromagnetic wave shielding film of the present disclosure attached to a surface of the printed wiring board with the adhesive layer joined to the ground circuit.

Advantages of the Invention

With the electromagnetic wave shielding film of the present disclosure, the tightness of attachment between the release film and the insulating protective layer can be checked, and it can be less likely to miss releasing the release film, leading to an improvement in productivity of a shielded wiring board.

DESCRIPTION OF EMBODIMENT

Figure 1:
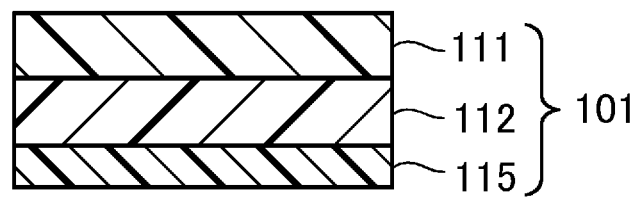
FIG. 1 is a cross-sectional view showing an electromagnetic wave shielding film according to an embodiment.
Figure 2:
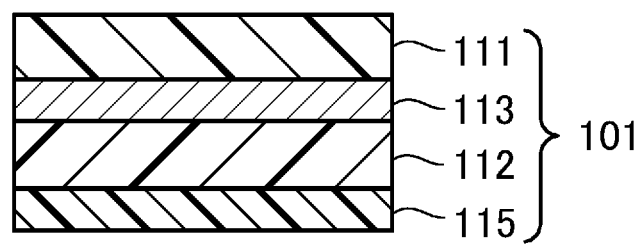
FIG. 2 is a cross-sectional view showing a variation of the electromagnetic wave shielding film.

As shown in FIG. 1, an electromagnetic wave shielding film 101 according to this embodiment includes an insulating protective layer 112, a release film 115 covering a surface of the insulating protective layer 112, and an adhesive layer 111 provided on the opposite side of the insulating protective layer 112 from the release film 115. In FIG. 1, the insulating protective layer 112 is in contact with the adhesive layer 111. Alternatively, as shown in FIG. 2, a shielding layer 113 can be provided between the insulating protective layer 112 and the adhesive layer 111.

In this embodiment, the release film 115 has a transmittance of 20-80% at a wavelength of 535 nm. The release film 115 also has a tight attachment confirmability index Ia of 11 or more, the tight attachment confirmability index Ia being represented by expression 1, and a presence visibility index Iv of 11 or more, the presence visibility index Iv being represented by expression 2:

$$Ia = (\Delta L^*_1{}^2 + \Delta a^*_1{}^2 + \Delta b^*_1{}^2)^{0.5} \quad \text{(expression 1)}$$

$$Iv = (\Delta L^*_2{}^2 + \Delta a^*_2{}^2 + \Delta b^*_2{}^2)^{0.5} \quad \text{(expression 2)}$$

where $\Delta L^*_1$ represents a difference between the L* value of a surface of the release film before release and the L* value of the surface of the release film after release, $\Delta a^*_1$ represents a difference between the a* value of the surface of the release film before release and the a* value of the surface of the release film after release, and $\Delta b^*_1$ represents a difference between the b* value of the surface of the release film before release and the b* value of the surface of the release film after release, and $\Delta L^*_2$ represents a difference between the L* value of the surface of the release film before release and the L* value of the insulating protective layer surface after release of the release film, $\Delta a^*_2$ represents a difference between the a* value of the surface of the release film before release and the a* value of the surface of the insulating protective layer after release of the release film, and $\Delta b^*_2$ represents a difference between the b* value of the surface of the release film before release and the b* value of the surface of the insulating protective layer after release of the release film. Note that the surface of the release film after release is opposite the surface of the release film that is attached to the insulating protective layer before release.

Therefore, the tight attachment confirmability index Ia is a color difference ΔE between the surface of the release film before release and the surface of the release film after release, and the presence visibility index Iv is a color difference ΔE between the surface of the release film before release and the surface of the insulating protective layer after release.

Note that the transmittance, L* value, a* value, and b* value of the release film 115, and the L* value, a* value, and b* value of the insulating protective layer 112, can be measured by techniques described in examples below.

The use of the release film 115 satisfying the above conditions can facilitate checking of the tightness of attachment between the release film 115 and the insulating protective layer 112. In addition, it is easy to visually recognize the presence of the release film 115 on the surface of the insulating protective layer 112, and therefore, it can be less likely to miss releasing the release film.

Note that the transmittance at a wavelength of 535 nm is 20% or more, preferably 30% or more, in terms of improvement of tight attachment confirmability, and is 80% or less, preferably 70% or less, in terms of improvement of visibility. The value of Ia is 11 or more in terms of improvement of tight attachment confirmability, and the value of Iv is 11 or more, preferably 20 or more, in terms of improvement of visibility. Although it is preferable that the values of Ia and Iv should have as large a value as possible, the practical values of these color differences are up to about 50.

The material for the release film 115 is not particularly limited and can be a polyester, a polyolefin, a polyimide, polyethylene naphthalate, polyphenylene sulfide, or the like. The transmittance at a wavelength of 535 nm can be adjusted by roughening the film surface or adding an additive to the film. At the same time, these techniques can adjust the L*a*b* coordinates of the release film 115. The L*a*b* coordinates of the release film 115 may be adjusted so as to satisfy expressions 1 and 2, depending on the L*a*b* coordinates of the insulating protective layer 112.

Note that as the additive added to the film, an organic or inorganic pigment can be used, and an inorganic white pigment is preferable in terms of improvement of tight attachment confirmability and visibility. As the inorganic white pigment, known white pigments can be used, including, for example, calcium carbonate, white lead, zinc oxide, barium sulfate, calcium sulfate, and titanium oxide.

Instead of forming the film using a material to which a pigment is previously added, the transmittance and L*a*b* coordinates of the film can be adjusted by applying a pigment or dye to a surface of the film. The pigment or dye may be applied to one or both surfaces of the film. Alternatively, the applied pigment or dye layer can be sandwiched by two films.

A release agent layer can be provided between the release film 115 and the insulating protective layer 112. The release agent layer can be formed by applying a silicon or non-silicon release agent to the surface of the release film 115 facing the insulating protective layer 112. The release agent layer can have a thickness of about 100 nm to 20 μm. The release agent layer having such a thickness has substantially no influence on the light transmittance and L*a*b* coordinates of the release film 115.

In this embodiment, the insulating protective layer 112 is not particularly limited as long as the insulating protective layer 112 has sufficient insulating properties and can protect the adhesive layer 111 and optionally the shielding layer 113, and can be formed of, for example, a thermoplastic resin, thermosetting resin, or actinic ray curable resin.

Examples of the thermoplastic resin include, but are not limited to, styrene resins, vinyl acetate resins, polyester resins, polyethylene resins, polypropylene resins, imide resins, and acrylic resins. Examples of the thermosetting resin include, but are not limited to, phenolic resins, epoxy resins, urethane resins, melamine resins, polyamide resins, and alkyd resins. Examples of the actinic ray curable resin include, but are not limited to, polymerizable compounds having at least two (meth)acryloyloxy groups in the molecule. The protective layer may be formed of a single material or two or more materials.

In order to adjust the L* value, a* value, and b* value of the insulating protective layer, a colorant may be added to the insulating protective layer. In particular, a black colorant that can reduce the L* value is preferably added. The black colorant can, for example, be a black pigment or a pigment mixture that is made black by subtractive color mixing of a plurality of pigments. The black pigment can be any of carbon black, ketjen black, carbon nanotubes (CNT), perylene black, titanium black, iron black, aniline black, and the like, or a combination thereof. The pigment mixture can, for example, be a mixture of pigments such as red, green, blue, yellow, violet, cyan, and magenta pigments.

In order to reduce the L* value, the amount of the black colorant added to the insulating protective layer 112 is preferably 0.5 mass % or more, more preferably 1 mass % or more. Note that the black colorant may be optionally added, and may not be added. Specifically, the L* value is preferably less than 30, more preferably less than 29, and even more preferably 23 or less.

The insulating protective layer 112 may contain not only a colorant but also optionally one or more of a curing accelerator, tackifier, antioxidant, plasticizer, UV absorber, defoamer, leveling agent, filler, retardant, viscosity-adjusting agent, antiblocking agent, and the like.

The insulating protective layer 112 may be a stack of two or more layers having different materials or different physical properties such as hardness or elastic modulus. For example, in the case where the insulating protective layer 112 is a stack of an outer layer having a lower hardness and an inner layer having a higher hardness, the outer layer has a cushioning effect, which can reduce pressure applied to the shielding layer 113 in a process of heating and pressurizing the electromagnetic wave shielding film 101 on the printed wiring board 102. Therefore, damage to the shielding layer 113 caused by a difference in level or a step of the printed wiring board 102 can be prevented or reduced. In the case where the insulating protective layer 112 is a stack of two or more layers, the L*a*b* coordinates may be adjusted for the outermost layer that is covered by the release film 115.

The insulating protective layer 112 can, for example, be formed by applying a composition for an insulating protective layer to a surface of the release film 115. The composition for an insulating protective layer may, for example, be prepared by adding a suitable amount of a solvent to a resin for an insulating protective layer. Instead of such a technique, for example, the release film 115 can be attached to a surface of the insulating protective layer 112 formed using another technique. In that case, the release film 115 and the insulating protective layer 112 may be attached together with a weak adhesive layer provided on a surface of the release film 115 or the insulating protective layer 112.

The thickness of the insulating protective layer 112 is not particularly limited and can be optionally suitably set to preferably 1 µm or more, more preferably 4 µm or more, and preferably 20 µm or less, more preferably 10 µm or less, and even more preferably 5 µm or less. The insulating protective layer 112 having a thickness of 1 µm or more can sufficiently protect the adhesive layer 111 and the shielding layer 113. The insulating protective layer 112 having a thickness of 20 µm or less facilitates setting of the elastic modulus and elongation at break of the electromagnetic wave shielding film 101 to a predetermined value.

In the case where the shielding layer 113 is provided, the shielding layer 113 can be formed of a metal foil, vapor deposition film, conductive filler, or the like.

The metal foil is not particularly limited and can be a foil containing any of nickel, copper, silver, tin, gold, palladium, aluminum, chromium, titanium, zinc, and the like, or an alloy of two or more thereof.

The thickness of the metal foil is not particularly limited and is preferably 0.5 µm or more, more preferably 1.0 µm or more. The metal foil having a thickness of 0.5 µm or more can prevent or reduce attenuation of a high-frequency signal of 10 MHz to 100 GHz which is transmitted to a shielded printed wiring board. The thickness of the metal foil is preferably 12 µm or less, more preferably 10 µm or less, and even more preferably 7 µm or less. The metal foil having a thickness of 12 µm or less can reduce the cost of a raw material, and leads to a good elongation at break of the shielding film.

The vapor deposition film is not particularly limited and can be formed by vapor deposition of nickel, copper, silver, tin, gold, palladium, aluminum, chromium, titanium, zinc, or the like. Vapor deposition can be performed using electroplating, electroless plating, sputtering, electron beam vapor deposition, vacuum vapor deposition, chemical vapor deposition (CVD), metal organic chemical vapor deposition (MOCVD), or the like.

The thickness of the vapor deposition film is not particularly limited and is preferably 0.05 µm or more, more preferably 0.1 µm or more. The metal vapor deposition film having a thickness of 0.05 µm or more allows the electromagnetic wave shielding film on a shielded printed wiring board to have excellent electromagnetic wave shielding characteristics. The thickness of the metal vapor deposition film is also preferably less than 0.5 µm, more preferably less than 0.3 µm. The metal vapor deposition film having a thickness of less than 0.5 µm allows the electromagnetic wave shielding film to have excellent flexural resistance, and can prevent or reduce damage to the shielding layer caused by a step of the printed wiring board.

For the conductive filler, the shielding layer 113 can be formed by applying a solvent to which the conductive filler is added to a surface of the insulating protective layer 112 and drying the solvent. The conductive filler can be a metal filler, metal-coated resin filler, carbon filler, or a mixture thereof. Examples of the metal filler include copper powder, silver powder, nickel powder, silver-coated copper powder, gold-coated copper powder, silver-coated nickel powder, and gold-coated nickel powder. These metal powders can be prepared by an electrolytic technique, atomization technique, or reduction technique. Examples of the shape of the metal powder include sphere, flake, fiber, and branch.

In this embodiment, the thickness of the shielding layer 113 may be suitably selected, depending on the required electromagnetic shielding effect and repetitive bending and sliding resistance. In the case where the shielding layer 113 is formed of a metal foil, the thickness of the shielding layer 113 is preferably 12 µm or less in order to ensure a sufficient elongation at break.

In this embodiment, the adhesive layer 111 may be provided on the opposite side of the insulating protective layer from the release film. The adhesive layer 111 contains at least one resin component of a thermoplastic resin, thermosetting resin, or the like. The adhesive layer 111 may also be a conductive adhesive layer containing a conductive filler.

In the case where the adhesive layer 111 contains a thermoplastic resin, the thermoplastic resin can, for example, be a styrene resin, vinyl acetate resin, polyester resin, polyethylene resin, polypropylene resin, imide resin, acrylic resin, or the like. These resins may be used alone or in combination.

In the case where the adhesive layer 111 contains a thermosetting resin, the thermosetting resin can, for example, be a phenolic resin, epoxy resin, urethane resin, melamine resin, polyamide resin, alkyd resin, or the like. The actinic ray curable composition is not particularly limited and can, for example, be a polymerizable compound having at least two (meth)acryloyloxy groups in the molecule. These compositions may be used alone or in combination.

The thermosetting resin contains, for example, a first resin component having a first functional group that is reactive, and a second resin component that reacts with the first functional group. The first functional group can, for example, be an epoxy group, amide group, or hydroxy group. The second functional group may be selected, depending on the first functional group. For example, in the case where the first functional group is an epoxy group, the second functional group can be a hydroxy group, carboxyl group, epoxy group, amino group, or the like. Specifically, for example, in the case where the first resin component is an epoxy resin, the second resin component can be an epoxy group-modified polyester resin, epoxy group-modified polyamide resin, epoxy group-modified acrylic resin, epoxy group-modified polyurethane polyurea resin, carboxyl group-modified polyester resin, carboxyl group-modified polyamide resin, carboxyl group-modified acrylic resin, carboxyl group-modified polyurethane polyurea resin, urethane-modified polyester resin, or the like. Of them, a carboxyl group-modified polyester resin, carboxyl group-modified polyamide resin, carboxyl group-modified polyurethane polyurea resin, and urethane-modified polyester resin are preferable. In the case where the first resin component is a hydroxy group, the second resin component can be an epoxy group-modified polyester resin, epoxy group-modified polyamide resin, epoxy group-modified acrylic resin, epoxy group-modified polyurethane polyurea resin, carboxyl group-modified polyester resin, carboxyl group-modified polyamide resin, carboxyl group-modified acrylic resin, carboxyl group-modified polyurethane polyurea resin, urethane-modified polyester resin, or the like. Of them, a carboxyl group-modified polyester resin, carboxyl group-modified polyamide resin, carboxyl group-modified polyurethane polyurea resin, and urethane-modified polyester resin are preferable.

The thermosetting resin may contain a curing agent that promotes a thermal curing reaction. In the case where the thermosetting resin has the first functional group and the second functional group, the curing agent can be suitably selected, depending on the types of the first and second functional groups. In the case where the first functional group is an epoxy group and the second functional group is a hydroxy group, the curing agent can be an imidazole curing agent, phenolic curing agent, cationic curing agent, or the like. These can be used alone or in combination. In addition, the thermosetting resin may contain, as an optional component, a defoamer, antioxidant, viscosity-adjusting agent, diluent, antisettling agent, leveling agent, coupling agent, colorant, retardant, and the like.

The conductive filler is not particularly limited and can be a metal filler, metal-coated resin filler, carbon filler, or a mixture thereof. Examples of the metal filler include copper powder, silver powder, nickel powder, silver-coated copper powder, gold-coated copper powder, silver-coated nickel powder, and gold-coated nickel powder. These metal powders can be prepared by an electrolytic technique, atomization technique, reduction technique, or the like. Of them, any of silver powder, silver-coated copper powder, and copper powder is preferable.

The average particle size of the conductive filler is preferably 1 μm or more, more preferably 3 μm or more, and preferably 50 μm or less, more preferably 40 μm or less, in terms of contact between filler particles. The shape of the conductive filler is not particularly limited and can be sphere, flake, fiber, branch, or the like.

The content of the conductive filler can be suitably selected, depending on the application, and is preferably 5 mass % or more, more preferably 10 mass % or more, and preferably 95 mass % or less, more preferably 90 mass % or less, of the total solid content. The content of the conductive filler is preferably 70 mass % or less, more preferably 60 mass % or less, in terms of embeddability. In the case where anisotropic conductivity is desired, the content of the conductive filler is preferably 40 mass % or less, more preferably 35 mass % or less.

The adhesive layer 111 can, for example, be formed by applying a composition for an adhesive layer to the insulating protective layer 112 or the shielding layer 113 formed on the insulating protective layer 112. The composition for an adhesive layer may be prepared by adding an appropriate amount of a solvent to the resin and filler for the adhesive layer.

The thickness of the adhesive layer 111 is preferably 1-50 μm in terms of control of embeddability.

Note that a releasable protective film may optionally be attached to a surface of the adhesive layer 111.

Figure 3:
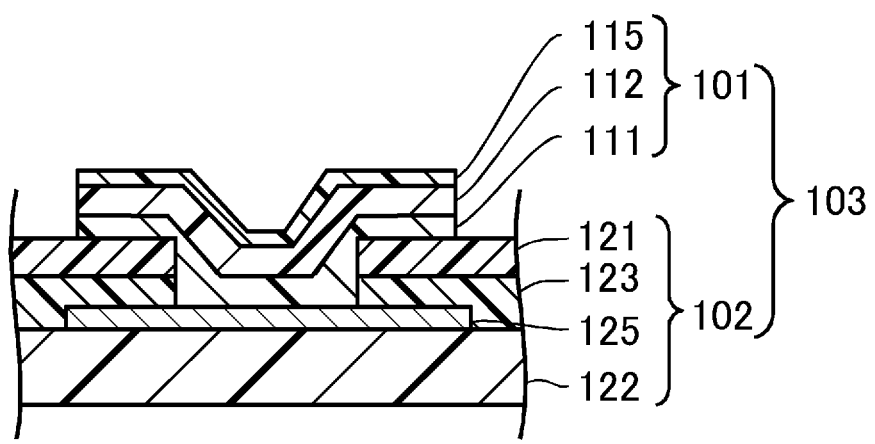
FIG. 3 is a cross-sectional view showing a shielded wiring board using an electromagnetic wave shielding film according to an embodiment.

As shown in FIG. 3, the electromagnetic wave shielding film 101 of this embodiment may be combined with the printed wiring board 102 to provide a shielded wiring board 103. The electromagnetic wave shielding film 101 may have the shielding layer 113.

The printed wiring board 102 has, for example, a base member 122, and a printed circuit including a ground circuit 125 provided on the base member 122. An insulating film 121 is attached to the base member 122 by an insulating adhesive layer 123. An opening for exposing the ground circuit 125 is provided at the insulating film 121. A surface layer such as a gold plating layer may be provided at an exposed portion of the ground circuit 125. Note that the printed wiring board 102 may be either a flexible substrate or a rigid substrate.

Figure 4:
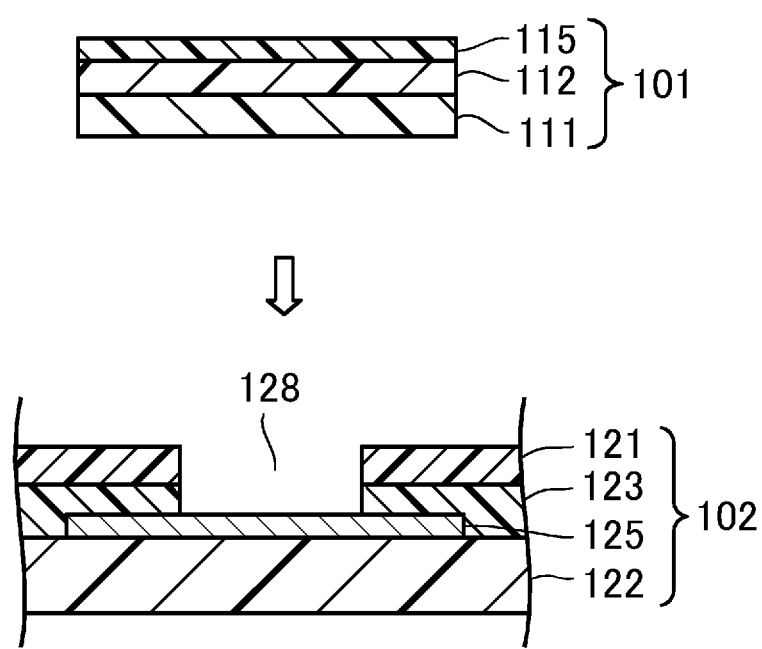
FIG. 4 is a cross-sectional view showing a step of attaching an electromagnetic wave shielding film to a printed wiring board.

As shown in FIG. 4, when the electromagnetic wave shielding film 101 is attached to the printed wiring board 102, the electromagnetic wave shielding film 101 is disposed on the printed wiring board 102 so as to position the adhesive layer 111 over an opening 128. Thereafter, the electromagnetic wave shielding film 101 and the printed wiring board 102 are sandwiched vertically by two heating plates (not shown) heated to a predetermined temperature (e.g., 120° C.), with a predetermined pressure (e.g., 0.5 MPa) for a short period of time (e.g., 5 seconds). As a result, the electromagnetic wave shielding film 101 is temporarily attached to the printed wiring board 102.

Next, the temperature of the two heating plates are set to a predetermined temperature (e.g., 170° C.) higher than during the preliminary attachment process, and pressurization is performed with a predetermined pressure (e.g., 3 MPa) for a predetermined period of time (e.g., 30 minutes). As a result, the electromagnetic wave shielding film 101 can be fixed to the printed wiring board 102. During the pressurization, the adhesive layer 111 is sufficiently embedded in the opening 128, so that strength and conductivity required by the electromagnetic wave shielding film 101 can be achieved.

The shielded wiring board 103 thus obtained can be subjected to chemical liquid treatments such as degreasing for washing the substrate surface and pickling for removing oxide coating on copper circuit portions, with the release film 115 attached to the surface of the insulating protective layer 112. After the chemical liquid treatments, the release film 115 can be released, and reflow can be performed. For the electromagnetic wave shielding film of this embodiment, the release film can be used as a protective film for protecting the insulating protective layer in chemical liquid treatments, leading to excellent productivity.

EXAMPLES

Examples of the electromagnetic wave shielding film of the present disclosure will now be described in greater detail. The examples below are merely illustrative and are in no way intended to limit the present disclosure.

<Production of Electromagnetic Wave Shielding Film>

A non-silicon release agent was applied to a surface of a predetermined release film to form a release agent layer. Next, a composition for an insulating protective layer was applied using a wire bar coater, and then dried by heating, to form an insulating protective layer. Next, a predetermined composition for a conductive adhesive layer was applied to the insulating protective layer using a wire bar coater, and then dried at 100° C. for 3 minutes, to obtain an electromagnetic wave shielding film.

The composition for an insulating protective layer was a thermosetting epoxy resin containing, as a black pigment, 20 wt % of carbon black having a primary particle size of 30 nm.

The composition for an adhesive layer was a thermosetting epoxy resin containing, as a filler, 15 wt % of a silver-coated copper powder having an average particle size of 15 μm.

<Measurement of Transmittance>

The transmittance at 535 nm was measured using an ultraviolet-visible spectrophotometer (UV-2600, manufactured by Shimadzu Corporation) to which an integrating sphere was attached.

<Measurement of L*a*b* Coordinates>

Measurement was performed using a portable integrating sphere spectrophotometer (Ci64, manufactured by X-Rite Inc.). Illuminant D65 was used as a light source.

<Calculation of Ia and Iv>

Based on the obtained measurement results, the tight attachment confirmability index Ia and the presence visibility index Iv were calculated by expression 1 and expression 2:

$$Ia = (\Delta L^*_1{}^2 + \Delta a^*_1{}^2 + \Delta b^*_1{}^2)^{0.5} \quad \text{(expression 1)}$$

$$Iv = (\Delta L^*_2{}^2 + \Delta a^*_2{}^2 + \Delta b^*_2{}^2)^{0.5} \quad \text{(expression 2)}$$

where $\Delta L^*_1$ represents a difference between the L* value of a surface of the release film before release and the L* value of the surface of the release film after release, $\Delta a^*_1$ represents a difference between the a* value of the surface of the release film before release and the a* value of the surface of the release film after release, and $\Delta b^*_1$ represents a difference between the b* value of the surface of the release film before release and the b* value of the surface of the release film after release, and $\Delta L^*_2$ represents a difference between the L* value of the surface of the release film before release and the L* value of a surface of the insulating protective layer after release of the release film, $\Delta a^*_2$ represents a difference between the a* value of the surface of the release film before release and the a* value of the surface of the insulating protective layer after release of the release film, and $\Delta b^*_2$ represents a difference between the b* value of the surface of the release film before release and the b* value of the surface of the insulating protective layer after release of the release film. Note that for the release film before release, the release film surface of the electromagnetic wave shielding film having the release film was measured. For the release film after release, the surface of the release film that is opposite the surface of the release film that was attached to the insulating protective layer before release was measured.

<Assessment of Tight Attachment Confirmability and Presence Visibility>

For the electromagnetic wave shielding film thus obtained, it was determined whether or not a difference in appearance was visually recognizable which was caused by refraction and scattering of light reflected by the surface of the insulating protective layer in a gap space between the release film and the insulating protective layer. If such a difference was visually recognizable, the release film was assessed as having good tight attachment confirmability. In addition, it was determined whether or not the presence of the release film uniformly tightly attached to the surface of the insulating protective layer was visually recognizable. If the presence was visually recognizable, the release film was assessed as having good presence visibility.

Example 1

As the release film, a polyethylene terephthalate film having a transmittance of 51.0% at a wavelength of 535 nm was used. Ia was 15.1 and Iv was 38.4, i.e., both the tight attachment confirmability and presence visibility of the release film were good.

Example 2

As the release film, a polyethylene terephthalate film having a transmittance of 47.6% at a wavelength of 535 nm was used. Ia was 11.7 and Iv was 42.8, i.e., both the tight attachment confirmability and presence visibility of the release film were good.

Example 3

As the release film, a polyethylene terephthalate film having a transmittance of 68.1% at a wavelength of 535 nm was used. Ia was 18.9 and Iv was 24.7, i.e., both the tight attachment confirmability and presence visibility of the release film were good.

Example 4

As the release film, a polyethylene terephthalate film having a transmittance of 56.7% at a wavelength of 535 nm was used. Ia was 11.9 and Iv was 38.8, i.e., both the tight attachment confirmability and presence visibility of the release film were good.

Example 5

As the release film, a polyethylene terephthalate film having a transmittance of 50.1% at a wavelength of 535 nm was used. Ia was 12.4 and Iv was 39.0, i.e., both the tight attachment confirmability and presence visibility of the release film were good.

Example 6

As the release film, a polyethylene terephthalate film having a transmittance of 50.0% at a wavelength of 535 nm was used. Ia was 14.2 and Iv was 37.6, i.e., both the tight attachment confirmability and presence visibility of the release film were good.

Comparative Example 1

As the release film, a polyethylene terephthalate film having a transmittance of 61.8% at a wavelength of 535 nm was used. Ia was 10.2 and Iv was 39.2, i.e., the tight attachment confirmability of the release film was defective, and the presence visibility of the release film was good.

Comparative Example 2

As the release film, a polyethylene terephthalate film having a transmittance of 90.8% at a wavelength of 535 nm was used. Ia was 27.7 and Iv was 8.8, i.e., the tight attachment confirmability of the release film was good, and the presence visibility of the release film was defective.

Comparative Example 3

As the release film, a polyethylene terephthalate film having a transmittance of 89.2% at a wavelength of 535 nm was used. Ia was 30.4 and Iv was 9.1, i.e., the tight attachment confirmability of the release film was good, and the presence visibility of the release film was defective.

Comparative Example 4

As the release film, a polyethylene terephthalate film having a transmittance of 87.5% at a wavelength of 535 nm was used. Ia was 22.0 and Iv was 7.5, i.e., the tight attachment confirmability of the release film was good, and the presence visibility of the release film was defective.

Comparative Example 5

As the release film, a polyethylene terephthalate film having a transmittance of 10.7% at a wavelength of 535 nm was used. Ia was 0.7 and Iv was 69.3, i.e., the tight attachment confirmability of the release film was defective, and the presence visibility of the release film was good.

The results of the assessment of Examples and Comparative Examples are shown together in Table 1, which is attached hereto as an Appendix.

INDUSTRIAL APPLICABILITY

The electromagnetic wave shielding film of the present disclosure facilitates checking of the tightness of attachment and presence of the release film, and therefore, is useful in, for example, production of a shielded wiring board.

DESCRIPTION OF REFERENCE CHARACTERS

101 Electromagnetic wave shielding film
102 Printed wiring board
103 Shielded wiring board
111 Adhesive layer
112 Insulating protective layer
113 Shielding layer
115 Release film
121 Insulating film
122 Base member
123 Insulating adhesive layer
125 Ground circuit
128 Opening

TABLE 1

| | | | Example 1 | Example 2 | Example 3 | Example 4 | Example 5 | Example 6 | Comp. Example 1 | Comp. Example 2 | Comp. Example 3 | Comp. Example 4 | Comp. Example 5 |
|---|---|---|---|---|---|---|---|---|---|---|---|---|---|
| Release film | Transmittance (%) | | 51.0 | 47.6 | 68.1 | 56.7 | 50.1 | 50.0 | 61.8 | 90.8 | 89.2 | 87.5 | 10.7 |
| | Before release | $L^*$ | 62.1 | 67.8 | 48.9 | 64.3 | 66.0 | 64.0 | 63.0 | 16.9 | 17.2 | 33.2 | 93.6 |
| | | $a^*$ | −2.0 | −2.7 | −1.4 | −1.8 | −2.5 | −2.1 | −0.6 | −0.4 | −0.4 | −0.3 | −0.6 |
| | | $b^*$ | −8.5 | −7.6 | −5.9 | −6.2 | −7.2 | −5.1 | −2.7 | −2.7 | −2.8 | −2.3 | −2.9 |
| | After release | $L^*$ | 76.2 | 78.5 | 67.4 | 75.8 | 77.8 | 77.3 | 73.2 | 44.6 | 47.6 | 55.2 | 94.2 |
| | | $a^*$ | −1.1 | −1.4 | −1.4 | −1.2 | −1.3 | −1.1 | −0.7 | −0.5 | −0.5 | −0.5 | −0.5 |
| | | $b^*$ | −3.2 | −3.0 | −4.7 | −3.1 | −2.9 | −3.1 | −1.4 | −2.5 | −2.4 | −1.8 | −2.7 |
| Insulating protective layer | After release | $L^*$ | 24.4 | 25.5 | 25.6 | 25.9 | 27.8 | 27.2 | 24.0 | 25.5 | 26.1 | 25.9 | 24.3 |
| | | $a^*$ | −0.2 | −0.1 | −0.1 | −0.1 | −0.1 | −0.1 | 0.7 | −0.2 | −0.2 | −0.1 | 0.1 |
| | | $b^*$ | −1.2 | −1.2 | −0.8 | −0.9 | −1.0 | −1.0 | 0.8 | −1.1 | −1.2 | −0.7 | −1.0 |
| | $\Delta L^*_1$ | | −14.1 | −10.7 | −18.5 | −11.5 | −11.6 | −13.3 | −10.2 | −27.7 | −30.4 | −22.0 | −0.6 |
| | $\Delta a^*_1$ | | −0.9 | −1.3 | 0.0 | −0.6 | −1.3 | −1.0 | 0.1 | 0.2 | 0.1 | 0.2 | −0.1 |
| | $\Delta b^*_1$ | | −5.3 | −4.0 | −4.3 | −3.2 | −4.3 | −5.0 | −1.2 | −0.2 | −0.4 | −0.5 | −0.2 |
| | $\Delta L^*_2$ | | 37.7 | 42.3 | 23.3 | 38.4 | 38.4 | 36.9 | 39.0 | −8.6 | −9.0 | 7.3 | 69.3 |
| | $\Delta a^*_2$ | | −1.9 | −2.6 | −1.3 | −1.7 | −2.4 | −2.0 | −1.3 | −0.2 | −0.3 | −0.3 | −0.7 |
| | $\Delta b^*_2$ | | −7.3 | −6.4 | −8.1 | −5.3 | −6.2 | −7.1 | −3.5 | −1.6 | −1.6 | −1.6 | −1.9 |
| | Ia | | 15.1 | 11.7 | 15.9 | 11.9 | 12.4 | 14.2 | 10.2 | 27.7 | 30.4 | 22.0 | 0.7 |
| | Iv | | 38.4 | 42.8 | 24.7 | 38.8 | 39.0 | 37.8 | 39.2 | 8.8 | 9.1 | 7.5 | 69.3 |
| Tight attachment confirmability | | | ○ | ○ | ○ | ○ | ○ | ○ | x | ○ | ○ | ○ | x |
| Presence visibility | | | ○ | ○ | ○ | ○ | ○ | ○ | ○ | x | x | x | ○ |

What is claimed is:

1. An electromagnetic wave shielding film comprising:
an insulating protective layer; and
a release film covering a surface of the insulating protective layer,
wherein
the release film has a transmittance of 20-80% at a wavelength of 535 nm, a tight attachment confirmability index Ia of 11 or more, the tight attachment confirmability index Ia being represented by expression 1, and a presence visibility index Iv of 11 or more, the presence visibility index Iv being represented by expression 2, $$Ia = (\Delta L^{*2}_1 + \Delta a^{*2}_1 + \Delta b^{*2}_1)^{0.5} \qquad \text{(expression 1)}$$

$$Iv = (\Delta L^{*2}_2 + \Delta a^{*2}_2 + \Delta b^{*2}_2)^{0.5} \qquad \text{(expression 2)}$$

where $\Delta L^*_1$ represents a difference between the L* value of a surface of the release film before release and the L* value of the surface of the release film after release, $\Delta a^*_1$ represents a difference between the a* value of the surface of the release film before release and the a* value of the surface of the release film after release, and $\Delta b^*_1$ represents a difference between the b* value of the surface of the release film before release and the b* value of the surface of the release film after release, and $\Delta L^*_2$ represents a difference between the L* value of the surface of the release film before release and the L* value of the surface of the insulating protective layer after release of the release film, $\Delta a^*_2$ represents a difference between the a* value of the surface of the release film before release and the a* value of the surface of the insulating protective layer after release of the release film, and $\Delta b^*_2$ represents a difference between the b* value of the surface of the release film before release and the b* value of the surface of the insulating protective layer after release of the release film, provided that the surface of the release film after release is opposite a surface of the release film that is attached to the insulating protective layer before release.

2. The electromagnetic wave shielding film of claim 1, further comprising:
   an adhesive layer provided on the opposite side of the insulating protective layer from the release film.

3. The electromagnetic wave shielding film of claim 2, further comprising:
   a shielding layer provided between the insulating protective layer and the adhesive layer.

4. A shielded wiring board comprising:
   a printed wiring board having a ground circuit; and
   the electromagnetic wave shielding film of claim 2 attached to a surface of the printed wiring board with the adhesive layer joined to the ground circuit.

* * * * *